United States Patent
Rozenburg et al.

(10) Patent No.: US 11,280,476 B2
(45) Date of Patent: Mar. 22, 2022

(54) OPTICAL CONVERTER

(71) Applicant: SCHOTT AG, Mainz (DE)

(72) Inventors: Keith Rozenburg, Factoryville, PA (US); Martin Letz, Mainz (DE); Ulrike Stoehr, Mainz (DE); Albrecht Seidl, Niedernberg (DE)

(73) Assignee: SCHOTT AG, Mainz (DE)

( * ) Notice: Subject to any disclaimer, the term of this patent is extended or adjusted under 35 U.S.C. 154(b) by 259 days.

(21) Appl. No.: 16/233,416

(22) Filed: Dec. 27, 2018

(65) Prior Publication Data

US 2019/0195467 A1 Jun. 27, 2019

(30) Foreign Application Priority Data

Dec. 27, 2017 (EP) ..................................... 17210639

(51) Int. Cl.
*H01L 33/50* (2010.01)
*C04B 38/00* (2006.01)
(Continued)

(52) U.S. Cl.
CPC ................ *F21V 9/30* (2018.02); *C04B 35/01* (2013.01); *C04B 35/44* (2013.01); *C04B 35/6262* (2013.01); *C04B 35/62695* (2013.01); *C04B 38/007* (2013.01); *C09K 11/7774* (2013.01); *G02B 5/20* (2013.01); *H01L 33/502* (2013.01); *C04B 2111/807* (2013.01); *C04B 2235/3224* (2013.01); *C04B 2235/3225* (2013.01); *C04B 2235/3229* (2013.01); *C04B 2235/3286* (2013.01); *C04B 2235/5463* (2013.01); *C04B 2235/764* (2013.01); *C04B 2235/77* (2013.01); *C04B 2235/9661* (2013.01)

(58) Field of Classification Search
CPC .... F21V 9/30; H01L 33/502; C04B 2111/807; C04B 2235/3224
See application file for complete search history.

(56) References Cited

U.S. PATENT DOCUMENTS

2010/0102251 A1* 4/2010 Ferrini ..................... G02B 5/02
250/484.4
2010/0258831 A1* 10/2010 Jagt ......................... H01L 33/46
257/98

(Continued)

FOREIGN PATENT DOCUMENTS

WO 2007107917 9/2007
WO 2008096301 8/2008
(Continued)

*Primary Examiner* — Fatima N Farokhrooz
(74) *Attorney, Agent, or Firm* — Ohlandt, Greeley, Ruggiero & Perle, L.L.P.

(57) ABSTRACT

An optical converter is provided that has both a stable colour even at highest luminous powers and a high luminous efficiency. The optical converter includes a ceramic element that is fluorescent so that light of a first wavelength is absorbed in the ceramic element and fluorescent having longer wavelength light is emitted. The ceramic element includes pores spatially irregularly distributed within the ceramic element. The distribution of the pores within the ceramic element is inhomogeneous so that the radial distribution function of the pore locations deviates from unity and has a maximum at a characteristic distance, the maximum having a value of at least 1.2.

15 Claims, 9 Drawing Sheets

(51) Int. Cl.
   *F21V 9/30*    (2018.01)
   *C04B 35/44*   (2006.01)
   *G02B 5/20*    (2006.01)
   *C09K 11/77*   (2006.01)
   *C04B 35/626*  (2006.01)
   *C04B 35/01*   (2006.01)
   *C04B 111/80*  (2006.01)

(56) References Cited

U.S. PATENT DOCUMENTS

| | | | | |
|---|---|---|---|---|
| 2011/0309384 | A1* | 12/2011 | Ito | H01L 33/505 |
| | | | | 257/88 |
| 2012/0181919 | A1* | 7/2012 | Wei | C09K 11/7706 |
| | | | | 313/503 |
| 2012/0326344 | A1* | 12/2012 | Kelso | C04B 35/638 |
| | | | | 264/21 |
| 2015/0062955 | A1* | 3/2015 | Sorg | F21S 43/16 |
| | | | | 362/553 |
| 2015/0295153 | A1* | 10/2015 | Kuramoto | H01L 33/52 |
| | | | | 257/98 |
| 2015/0329778 | A1 | 11/2015 | Menke | |
| 2017/0253797 | A1 | 9/2017 | Shibuya | |
| 2019/0093832 | A1* | 3/2019 | Soer | F21K 9/62 |

FOREIGN PATENT DOCUMENTS

| | | |
|---|---|---|
| WO | 2011094404 | 8/2011 |
| WO | 2014114473 | 7/2014 |

* cited by examiner

OPTICAL CONVERTER

CROSS REFERENCE TO RELATED APPLICATIONS

This application claims benefit under 35 USC § 119 of European Application 17 210 639.5 filed Dec. 27, 2017, the entire contents of which are incorporated herein by reference.

BACKGROUND

1. Field of the Invention

The invention concerns an optical converter element for conversion of light into secondary light with longer wavelengths, i.e. an optical converter for down-conversion of light.

2. Description of Related Art

Optical converters or phosphors, respectively, are widely employed to adapt the spectral range of semiconductor light sources.

Down-conversion phosphors such as Cerium doped rare earth metal garnets are typically used in light projection systems requiring accurate color reproduction at a high luminous intensity. The purpose of the phosphor is to absorb a coherent, high power, high frequency light source and convert it into lower frequency diffusely emitted light.

An important application is the provision of white light using blue light emitting diodes. A phosphor is excited by the absorbed blue light and emits light of longer wavelength, typically yellow light. White light is generated by mixing the yellow light with a fraction of the initial blue light.

A typical problem that arises in direct lighting applications is that when the power output of the high frequency source is very high, too much high frequency light is mixed in to the diffusely reflected emission, giving an undesirable color to the projected light. This problem may be addressed by manipulating the amount and size of the porosity to promote diffuse reflectance of the converted light and at the same time limit diffuse reflectance of the source light. A problem arises in color image projection in that the highest power of emission cannot be separated from a specific color of emission. The desired color of emission may only be achieved in combination with lower efficiency. This is since a high intensity of the source light may result in quenching phenomena that reduce the quantum efficiency and hence increase the fraction of unconverted light in the output of the converter.

WO 2007/107917 A2 discloses a porous ceramic as a conversion element with a high density of at least 97% with pore diameters substantially between 200 nm and 5000 nm. The pore diameter distribution follows a log-normal distribution. The pore sizes and the density of the ceramics are chosen so as to obtain a high luminous efficiency and a Lambertian radiation pattern. However, the problem of a color change at high emission powers may still be present.

SUMMARY

It is therefore an object of the invention to provide an optical converter which has both a stable colour even at highest luminous powers and a high luminous efficiency. This object is solved by the present application.

Accordingly, the invention concerns an optical converter comprising a ceramic element, the ceramic element being fluorescent so that light of a first wavelength (i.e. the source light) is absorbed in the ceramic element and fluorescent having longer wavelength light is emitted. The ceramic element comprises pores that are spatially irregularly distributed within the ceramic element, i.e. the pores are not arranged according to a repetitive or periodic pattern. The distribution of the pores within the ceramic element is inhomogeneous in a way that the radial distribution function of the pore locations deviates from unity and has a maximum at a characteristic distance, the maximum having a value of at least 1.2. Preferably, the maximum has a value of at least 1.3. The pore locations according to the invention are the locations of the pore centres.

Thus, in a ceramic element according to the invention the distribution of the pores exhibits some degree of clustering. This clustering of the pores provides for an improved scattering behaviour for source light and secondary (i.e. fluorescent) light. Further due to this scattering property, the source light (i.e. the light of a first wavelength) can penetrate deeper into the ceramics so that a greater volume element of the ceramics contributes to the conversion. This reduces quenching phenomena at high luminous power, thereby stabilising the colour of the emitted light. Accordingly, the inventive structure of the ceramic element insures that the turbidity of the material with respect to the source light and the emitted light is optimized for the projected colour desired. The luminous intensity of the projected colour is also optimized.

To control the scattering and penetration depth of source light a fluorescence light, it is advantageous to provide clustered pores in a way that the characteristic distance, i.e. the maximum of the RDF lies in a range from 1.0 µm to 3 µm, preferably in a range from 1.3 µm to 2.5 µm.

Preferably, the converter absorbs blue light as light of a first wavelength and emits a specific, typically broad spectrum of light in the visible range from green over yellow to red light as fluorescent light having longer wavelength. The colour impression of the emitted spectrum is typically characterized by its centroid wavelength. In particular, the ceramic element may be adapted to absorb blue light having a wavelength of 450 nm and to emit green, or yellow, or reddish light having a centroid wavelength of about 550 nm, or 570 nm, or 580 nm, respectively. Of course, these specific emission centroid wavelengths are examples and can be "tuned" further by appropriate composition of the rare earth metal garnet.

The distribution of the pores can be influenced by the processing of the starting material for the ceramics. Generally, the starting material is milled, pressed and then sintered to produce the ceramic element. The heterogeneous, partly clustered spatial pore distribution can be achieved by maintaining or producing a certain agglomeration of the powdered starting material. Specifically, a method for producing a ceramic element for an optical converter according to the invention comprises the steps: calcination of the starting material, slurrying the starting material in a suitable liquid to prepare a suspension, milling of the suspension of the calcined raw material, drying of the suspension to obtain a powdered starting material, pressing the powdered raw material to obtain a pressed blank, and sintering the pressed blank.

The method further comprises maintaining or producing, resp. inducing a partial agglomeration of the powdered starting material so that the pressed blank comprises an inhomogeneity in the grain sizes and the ceramic element produced therefrom comprises a spatial inhomogeneity of the pore distribution, resulting in a radial distribution function of the pore locations as defined above, i.e. which deviates from unity and has a maximum at a characteristic distance, the maximum having a value of at least 1.2.

In the following, the invention is described more detailed with reference to the drawings.

DETAILED DESCRIPTION

FIGS. 1a-1d generally depicts processing steps to fabricate a ceramic element 3 for an optical converter 1. Basically, the process steps may follow the sequence of method steps according to WO 2014/114473 A1. However, the method may be altered by the processing times. As well, some method steps, in particular regarding milling and homogenisation may be omitted or repeated.

Figure 1A:
FIGS. 1a-1d show a schematic of basic process steps to produce a ceramic element.
Figure 1B:
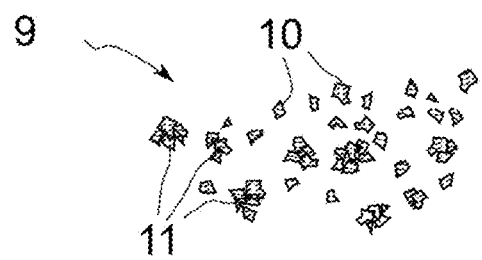

However, similarly to WO 2014/114473 A1, the starting material is calcined, a slurry is prepared using a suitable liquid and the slurry is milled. As shown in FIG. 1a, a powdered starting material 9 with fine particles 10 is obtained by drying the suspension. In difference to WO 2014/114473 A1, however, a partial agglomeration of the powdered starting material 9 is maintained during the milling or induced subsequently. The partially agglomerated starting material 9 is shown in FIG. 1b. Accordingly, some of the particles 10 are agglomerated to larger grains 11.

Figure 1C:
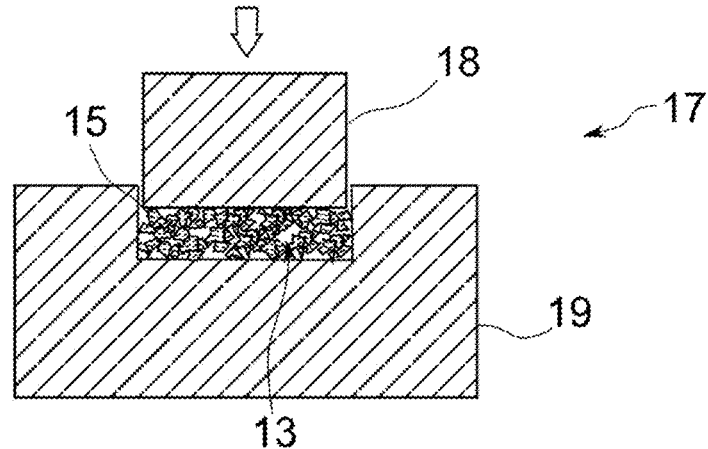

Subsequently, as shown in FIG. 1c, the powdered starting material 9 is pressed with a press mold 17 to form a press blank 15. As shown, the starting material 9 is compressed uniaxially by pressing a stamp 18 onto a die 19 of the press mold 17.

However, the process may involve additional or alternative isostatic compression. Generally, the pressing and the subsequent sintering may be performed according to WO 2014/114473 A1, i.e. by uniaxially compressing the starting materials dried in step e) at a pressure from 10 to 50 MPa to form the pressed blank 15 and further isostatically compressing the green body at a pressure from 100 to 300 MPa. Due to the partial agglomeration, however, voids 13 or at least regions with lower density remain in the pressed blank 15.

The blank 15 is then burned at a temperature in a range from 600 to 1000° C., and reactively sintered at a temperature in a range from 1550 to 1800° C.

Figure 1D:
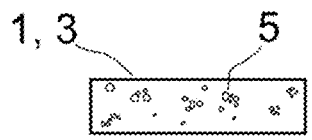

As a result, a ceramic element 3 as shown in FIG. 1d is obtained. The ceramic element 3 may directly be used as the optical converter 1. Alternatively, the ceramic element may be further processed to obtain an optical converter 1. For example, the ceramic element may be coated with one or more functional coatings. As well, the ceramic element may be further processed to obtain a desired size and/or surface quality. Such further processing may include cutting and/or polishing. The ceramic element 3 includes spatially distributed pores 5. However, as already indicated in the schematic presentation of FIG. 1d, although being irregular, the distribution is not fully random. Rather, there is a tendency for a clustering of the pores 5 which accounts for the improved scattering properties for the source light and fluorescent light.

Generally, a doped garnet phosphor is preferred as the ceramic element. Particularly preferred is a cerium doped yttrium-aluminium garnet (Ce:YAG) or a cerium doped lutetium-aluminium garnet (Ce:LuAG) or a cerium doped gadolinium/yttrium aluminium garnet (Ce:Gd/YAG). Cerium doped gadolinium/yttrium garnet preferably has a content of Gd of preferably 0 to 20% of Gd replacing Y in the lattice. To produce a doped garnet phosphor, a ceramic phase of composition $A_3B_5O_{12}$ doped with cerium as a first activator, with A selected from a group consisting of elements Y, Gd, Lu, and combinations thereof, and B selected from a group consisting of elements Al, Ga, and combinations thereof may be chosen for the ceramic element. To produce a ceramic element of this composition, $A_2O_3$, $B_2O_3$, and $CeO_2$ in oxide form may be used as starting materials. The composition may be chosen to result in a compound $(A_{1-x}, Ce_x)_3B_5O_{12}$, where $0.0005 > x > 0.05$. Thus, 0.05 to 5 percent of the atoms of type A are replaced by cerium.

A concentration within this range ensures a high conversion efficiency and is balanced with the scattering of the pores to maintain a sufficient penetration depth of the source light. According to a further embodiment, the starting material comprises $A_3B_5O_{12}$. The powdered $A_3B_5O_{12}$ may be cerium doped and/or the desired cerium content may be adjusted by adding a desired amount of $CeO_2$.

Figure 2:
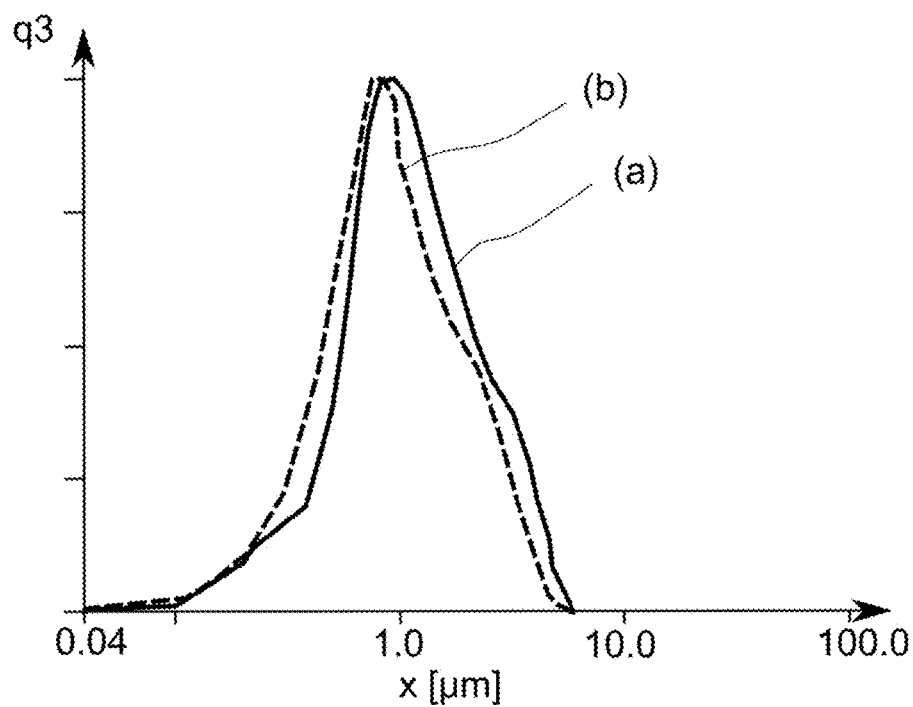
FIG. 2 shows histograms of particle size distributions for two powdered starting materials.

FIG. 2 shows a comparison of the particle size distributions of two powdered starting materials 9. The measurement of the particle sizes was made with the laser diffraction method in liquid dispersion. The ordinate variable q3 denotes the fraction of the overall volume for particles having a diameter x. The diameter values x on the abscissa are scaled logarithmically. Curve (a) is a histogram for a powdered starting material 9 from which a ceramic element 3 according to the invention was produced. Curve (b) represents the histogram of a comparative example. The converter produced from the comparative example has a lower luminous efficiency and a radial distribution function of the pore locations without a distinct maximum of more than 1.2.

At first glance, the difference between both histograms is not very striking. In particular, the maxima of both histograms are nearly at the same particle diameter.

Figure 3:
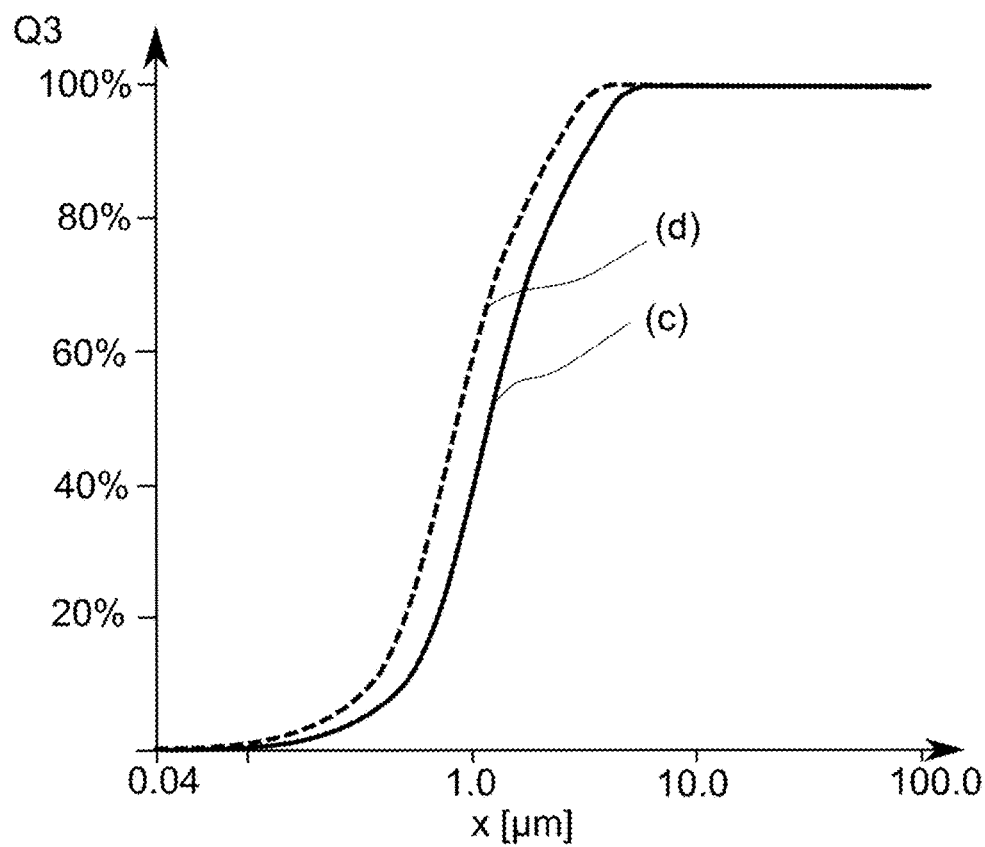
FIG. 3 shows the corresponding cumulative values of the particle sizes.

However, according to curve (a), larger particles are somewhat more frequent. This becomes apparent when the cumulative distributions of particle sizes are considered. The cumulative values Q3 are shown in FIG. 3. Curve (c) is the cumulative pore volume of the powdered starting material according to the invention, Curve (d) shows the values of the comparative examples. The d99 values (i.e. the diameter value which is the upper limit for 99% of the particles) according to the measurement are 3.7 µm for the comparative example and 4.7 µm for the powdered starting material according to the invention. Generally, without restriction to the example, the grain size distribution of the powdered starting material 9 preferably has a d99 value for the particle diameter of more than 4.25 µm.

Figure 4:
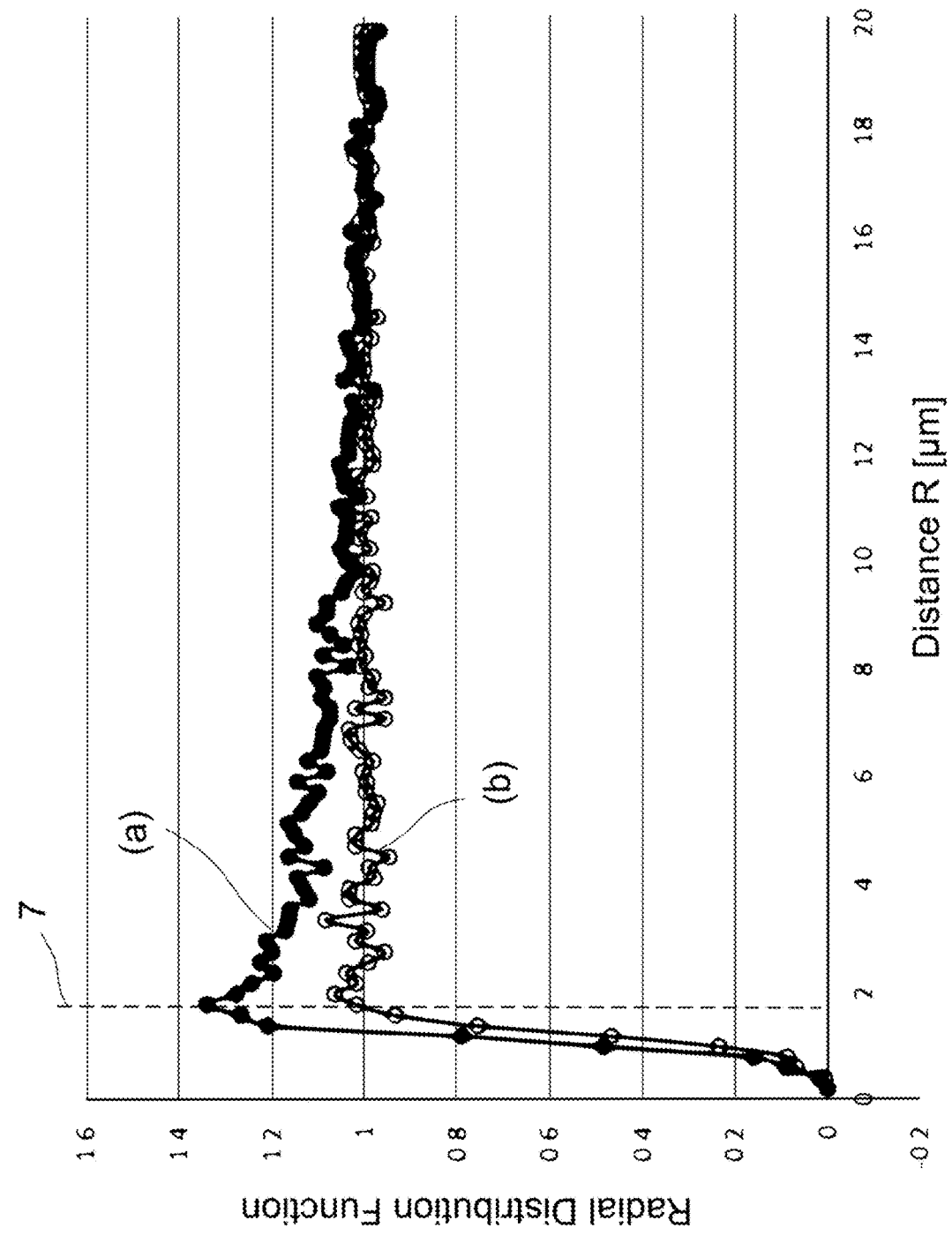
FIG. 4 shows the radial distribution function of the pores for a ceramic element according to the invention and a comparative example.

FIG. 4 shows the radial distribution function ("RDF") of the pores 5 of a ceramic element 3 according to the invention (curve (a)) and of a comparative example (curve (b)). Both examples are Ce:YAG ceramics. The RDF of the comparative example shows a steep rise with increasing distance until unity is reached. For larger distances, the RDF then remains constant at unity. This indicates that the pore distribution is essentially irregular.

Similar to curve (b), curve (a) also exhibits a steep rise of the RDF at small distances. In contrast to the comparative example, the RDF of the inventive example has a distinct maximum at a characteristic distance 7 of about 1.8 µm. This is within the preferred range of 1-3 µm to optimise luminous intensity and stabilise the colour spectrum of the emitted light even at highest luminous powers. The maximum value of the example is higher than 1.3. Further, generally, the radial distribution function of the pores 5 converges to unity with increasing distances higher than the characteristic distance 7. As can be seen, the convergence is quite slow so that even at distances of 8 µm the RDF values are still higher than unity. Generally, without restriction to the particular example shown in FIG. 4, the RDF can be further characterised in that below the characteristic distance 7 the radial distribution function of the pores 5 diminishes towards shorter distances and drops below unity.

In the following table, some characteristic parameters for the ceramic elements are listed:

| | Density | Ln(x), ln(µm) | Efficacy, lm/W | $c_y$ | $c_x$ |
|---|---|---|---|---|---|
| Ceramic element according to the invention | 95.4 | −0.36 | 340 | 0.490 | 0.382 |
| Comparative example | 96.1 | −0.08 | 321 | 0.472 | 0.372 |

The density is given as percentage of the theoretical density for yttrium aluminium garnet, which is 4560 kg/m$^3$ in this example. The efficacy is the luminous flux divided by the power of the laser entering the material. The colour coordinates according to the CIE 1931 are given by $c_y$ and $c_x$. They describe the eyes perception of the colour emitted by the device.

As can be seen from the listed data, the efficacy of the inventive example is higher than that of the comparative example.

Ln(x) denotes the logarithmic modal value of the pore size distribution and thus corresponds to the modal value of a log-normal-distribution. Generally, without restriction to the examples, it is preferred that the distribution of the pore diameters has a modal value of between 0.5 µm to 1.2 µm to promote strong scattering of the fluorescence light. Modal values of between 0.6 µm to 0.9 µm are particularly suited. The comparative example has a modal value of 0.92 µm and thus also lies within the preferred range. However, the comparative example lacks a distinct maximum in the RDF.

The density of the ceramic element is not limited and can be as high as 99% or more, such as at most 99.5% or 99.9%. To improve the efficacy of the ceramic element for most applications, the density is preferably at least 90%, more preferably at least 95%.

Further, according to one aspect of the invention it is preferred that the ceramic element 3 has a density of below 98%, preferably below 97%, more preferably below 96.3 percent, particularly preferably of below 96 percent of the theoretical solid-state density. Accordingly, one preferred density is lower than the value of a least 97% according to WO 2007/107917 A2.

According to other aspects of the invention it is preferred that the ceramic element 3 has a density of more than 96%, preferably more than 97%, or even more than 98%.

Figure 5A:
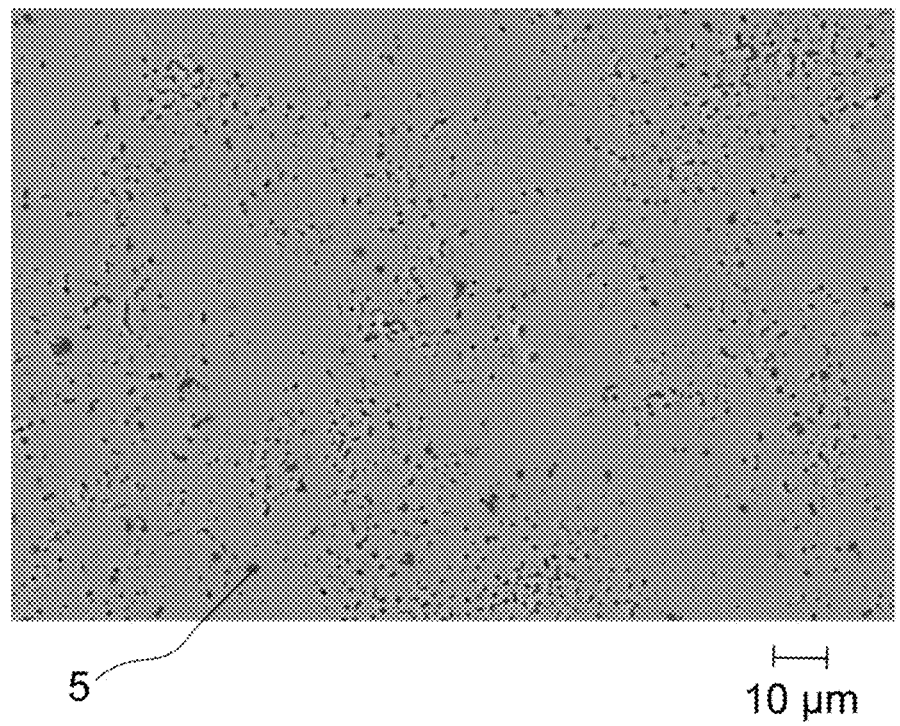
FIGS. 5a-5b show SEM micrographs of ceramic elements.
Figure 5B:
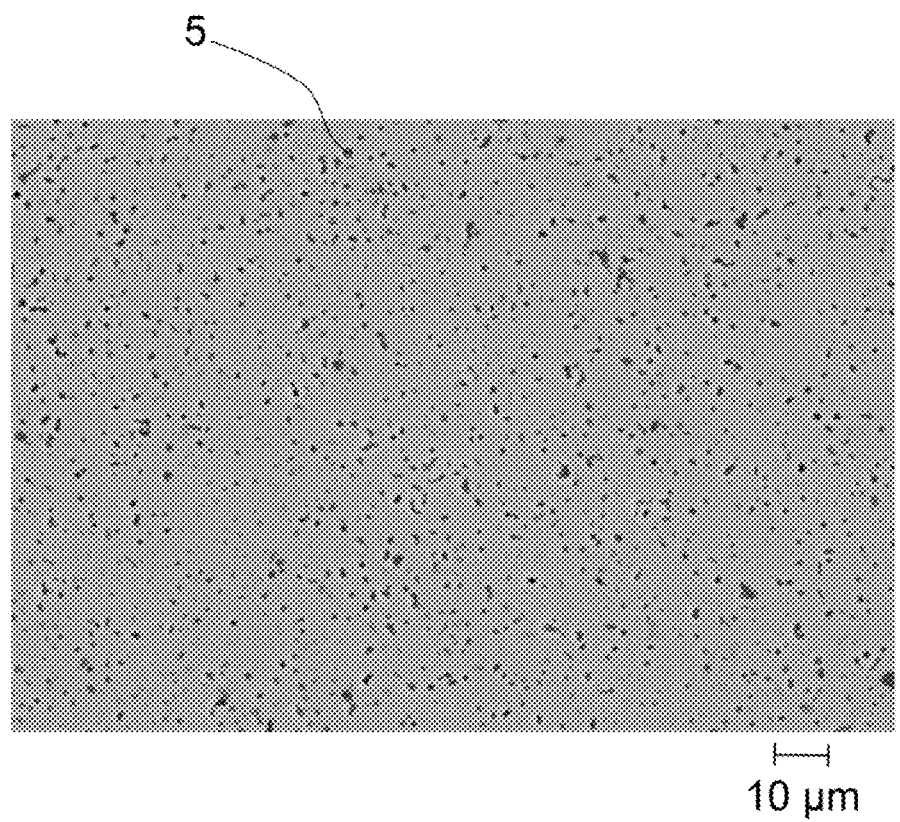

In FIGS. 5a-5b, two SEM micrographs of the examples discussed above are shown. FIG. 5a is a SEM image of the ceramic element according to the invention. FIG. 5b shows the image taken from the comparative example. The partial clustering of the pores 5 forming cloud-like structures with nearly pore free intermediate areas can be clearly seen in FIG. 5a. In contrast thereto, although irregularly positioned as well, the pores are uniformly distributed in the comparative example.

It is evident from FIG. 5a that the maximum of the RDF also leads to an inhomogeneity of the material since there are sections with considerably varying densities of pores. It is thus generally advantageous if the maximum of the RDF does not become extremely large. Thus, according to a refinement of the invention, the pores 5 are distributed in a manner so that the maximum of the radial distribution function has a value of less than 2.

The RDF can be directly retrieved from SEM micrographs as exemplary shown in FIG. 5a-5b. The RDF shown in FIG. 4 are retrieved using the image processing software "ImageJ". A multitude of images may be loaded as a stack and processed at once. The RDF of particle centres is calculated using an RDF-macro contained in the "Radial Profile" plugin. The macro also contains a function to scale the image. Scaling can be performed using the scale bar that is usually indicated in the SEM micrographs.

Generally, there should be a sufficient number of samples to attain a high confidence level for the RDF. Accordingly, the sample area evaluated to determine the mutual distances should be not too small. Preferably, the RDF is determined on a basis of at least one image (preferably a SEM micrograph) covering a sample area of at least 0.01 mm$^2$.

Scattering of light along a travelling path generally results in a gradual intensity loss. This loss can be similarly described as an absorption and thus leads to an exponential intensity drop. The parameter describing the attenuation due to scattering is generally referred to as turbidity.

Specifically, the turbidity $\tau_{scat}$ defined as is $$\tau_{scat} = N_{scat} \cdot \sigma_{scat}/m^{-1}$$

with $N_{scat}$ being the concentration of scattering centres and $\tau_{scat}$ being the integrated scattering cross section.

The light attenuation along a travelling path of length d follows the Lambert-Beer law so that the intensity I after travelling through a layer of thickness d is given by $$I = I_0 \cdot \exp(-\tau_{scat} \cdot d).$$

Figure 6:
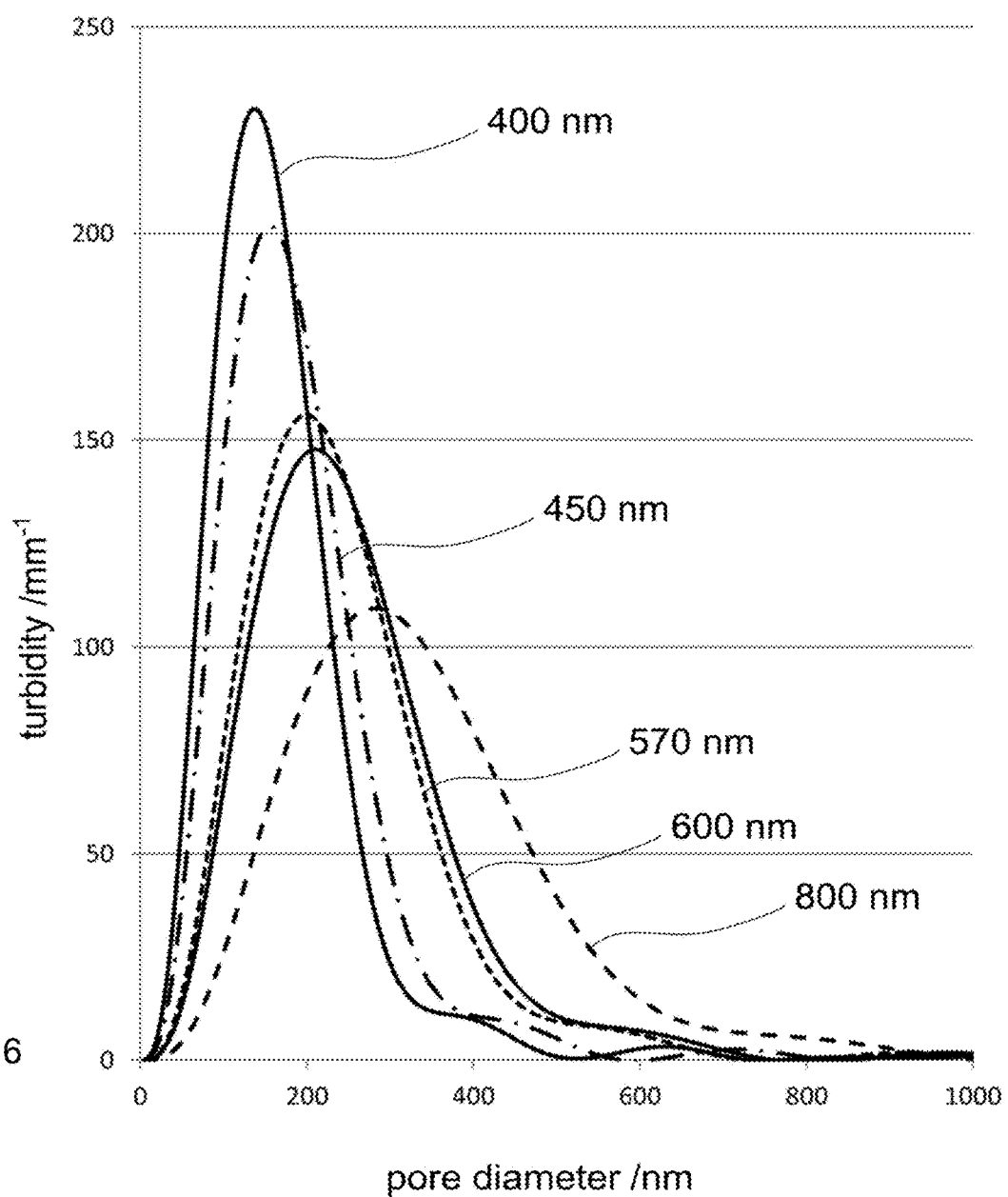
FIG. 6 is a plot of the turbidity versus the pore diameter for various wavelengths.

The turbidity is a function of the wavelength. However, according to the theory of Mie-scattering, blue light is generally more intensely scattered than yellow light. FIG. 6 shows the turbidity as a function of the pore size for wavelengths of 400 nm, 450 nm, 570 nm, 600 nm and 800 nm. The curves were calculated on the basis of a constant packing fraction of 96%, i.e. assuming a constant density of the ceramics. As evident from FIG. 6, blue light is generally scattered much stronger than yellow light. However, the clustered pores as present in a ceramic element according to the invention, effect coherent scattering as an additional effect. This way, scattering of yellow light can be enhanced. In particular, according to one embodiment of the invention, the turbidity value $\tau_{scat}$ of the ceramic element 3 for light having a wavelength of 570 nm may be even larger than the turbidity value for light having a wavelength of 450 nm.

The advantageous features of the ceramic element result from different scattering mechanisms for blue and yellow light. The smaller inter-cluster spacing of the pores prefers coherent scattering of the longer wavelength fluorescent light and effects strong back scattering and remission of the light.

Figure 7:
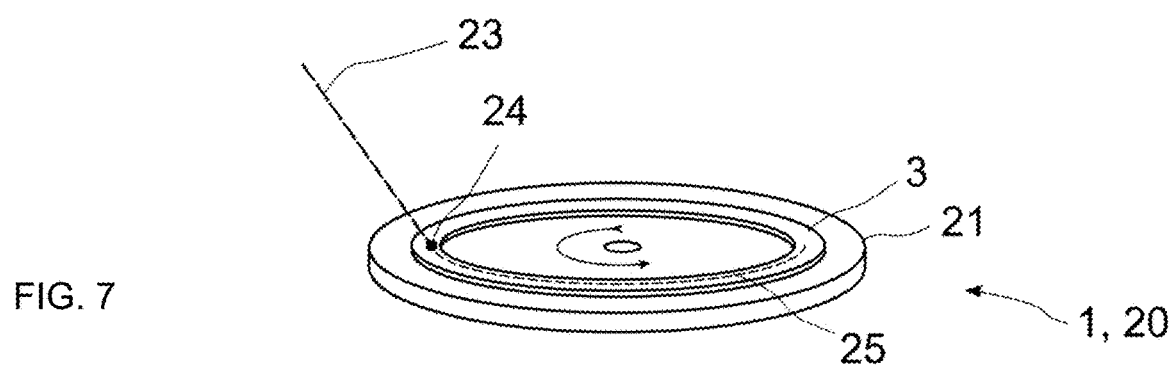
FIG. 7 shows a converter wheel with an optical converter.

FIG. 7 shows a preferred embodiment of the invention. According to this embodiment, the optical converter 1 is a converter wheel 20. In this embodiment a disc or ring shaped ceramic element 3 is mounted onto a disc shaped carrier 21 so as to form a converter wheel 20. In use, a laser beam as the light of a first wavelength is directed onto the ceramic element 3 while the wheel 20 is turned about its central axis so that point 24 of incidence of the beam follows a circular trace 25 on the ceramic element 3. Due to the rotation of the wheel, the laser energy and accordingly heating due to the absorption is distributed along trace 25 to allow for high laser powers and reduces detrimental effects such as thermal quenching.

Figure 8:
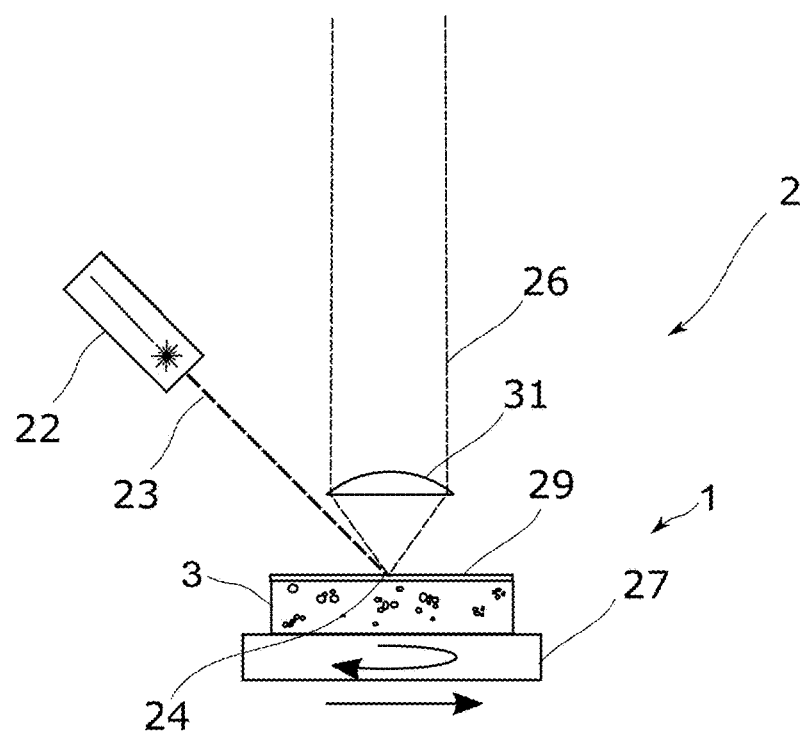
FIG. 8 shows a light source with an optical converter.

According to a further aspect of the invention, a light source comprising the converter element according to the invention is provided. An illustrative embodiment of a light source 2 is shown in FIG. 8. Without restriction to the exemplary embodiment as shown, the light source 2 comprises a source light emitter and an optical converter 1 according to the invention, the source light emitter being arranged to direct its source light onto the ceramic element 3 of the optical converter 1 so that the optical converter emits secondary light having a longer wavelength than the source light. The ceramic element 3 is fixed on a mount 27 which may also be part of the optical converter 1. The mount may be static to hold the ceramic element fixed in relation to the source light beam. Further, as shown in FIG. 7, the mount 27 may be adapted to rotate the ceramic element so that the point of incidence follows a circular path on the ceramic element. Further, the mount may also reciprocate the ceramic element 3 to move the point of incidence along the ceramic element. Thus, the mount may be static or adapted to provide a rotational or reciprocating movement to the ceramic element.

As shown, the source light emitter may be a laser 22. A lens 31 may be provided to collimate the emitted light beam 26.

In a further embodiment, generally, the ceramic element 3 of the optical converter 1 may be provided with a coating 29. In the example of FIG. 8 the side of the ceramic element 3 onto which the laser beam 23 impinges, is coated with a coating 29. In particular, the coating may be functional to alter or improve the optical properties of the converter. According to one embodiment, the coating 29 may be dichroitic so as to inhibit emission of light of a certain wavelength range. As well, the coating may be antireflective to reduce reflections of the source light and/or the secondary light at the surface. Further, a reflective coating may be used to reflect light at the backside of the ceramic element.

In the examples of FIGS. 2-4 individual samples of ceramic converters have been examined. In the following, statistical data retrieved from a multitude of samples are discussed.

Three powder batches have been produced and processed to of ceramic convertors. Color coordinates cx, cy as well as efficacy were measured at all samples from these batches. Comparison was performed between 1017 samples of ceramic converters according to the invention with 457 samples from regular production as reference samples.

Figure 9:
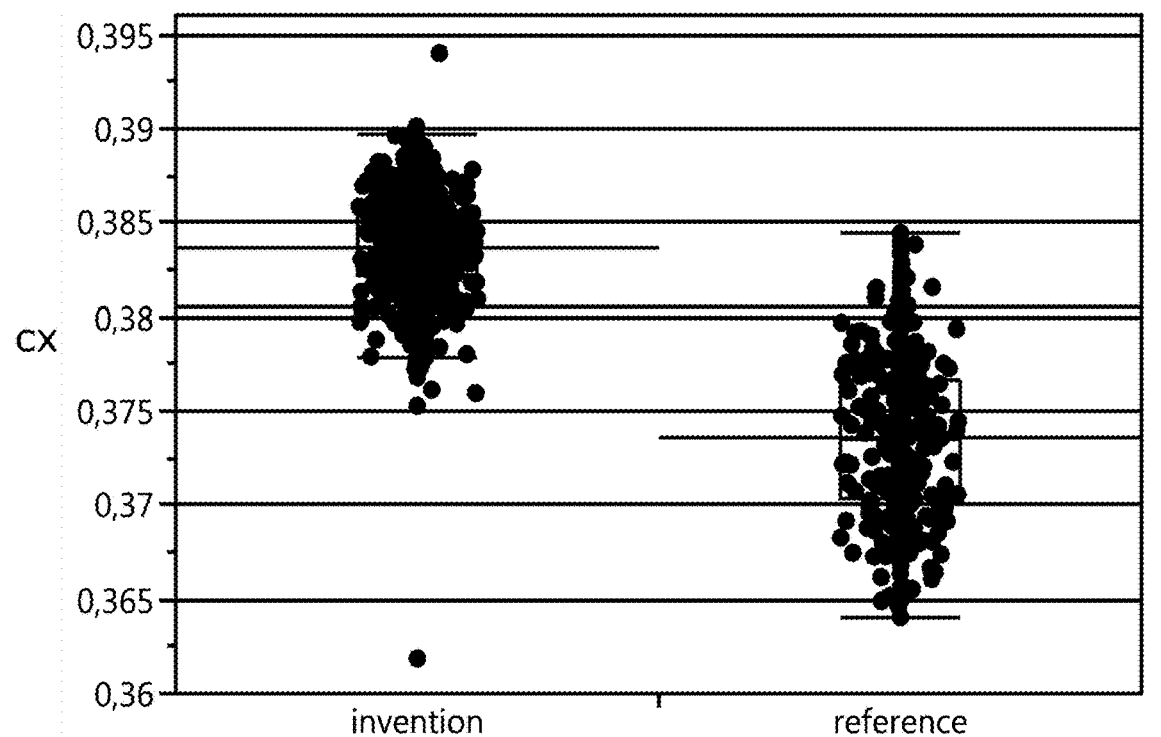
FIG. 9 shows two diagrams with a comparison of cx- and cy color coordinates for a multitude of samples.
Figure 9:
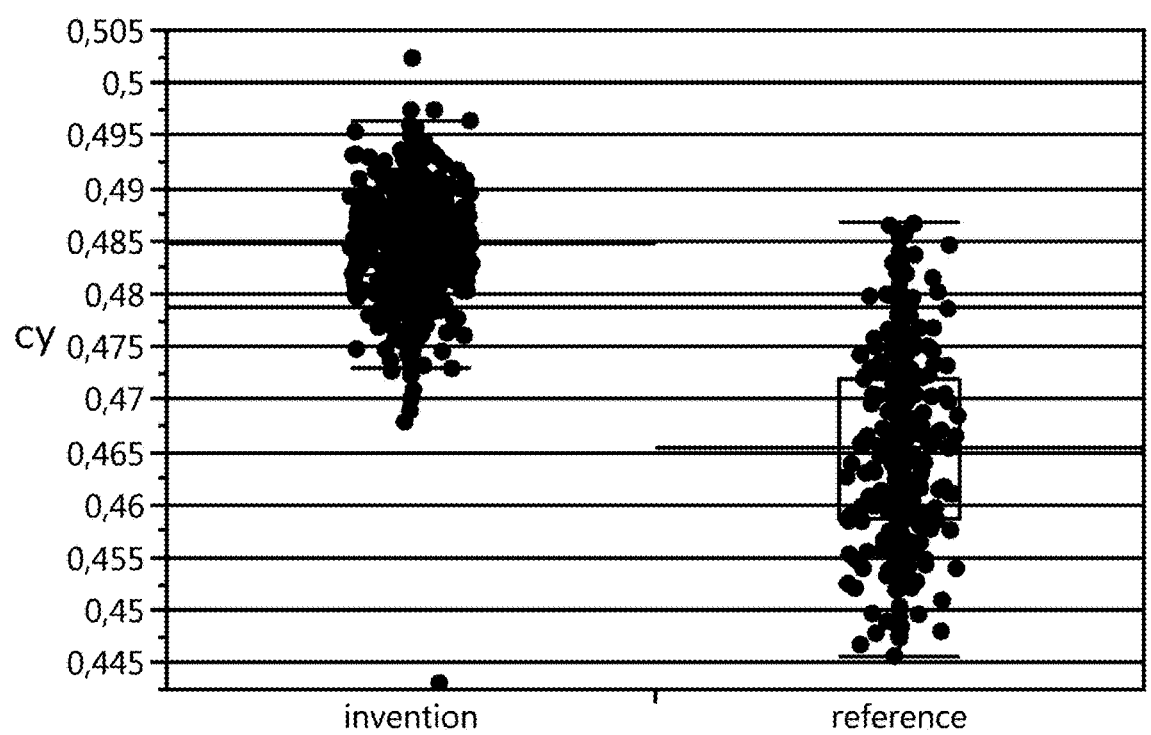

FIG. 9 shows the measured values for the cx color coordinate (upper diagram) and the cy color coordinate of samples according to the invention and of the reference samples. The results demonstrate the improved properties of ceramic elements according to the invention. In comparison with the reference samples, both cx and cy values are at higher level (less blue, more yellow) with a more narrow distribution.

In correspondence to this, efficacy also show more narrow distribution on high level. Mean of efficacy of new art is significantly higher than of conventional samples having no pronounced peak in the RDF.

Figure 10A:
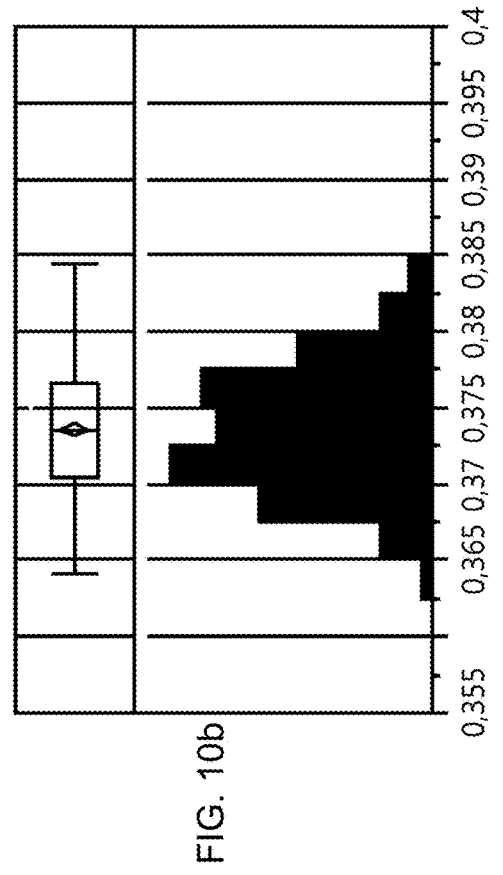
FIGS. 10a-10d show the statistical distributions of the values according to FIG. 9.
Figure 10C:
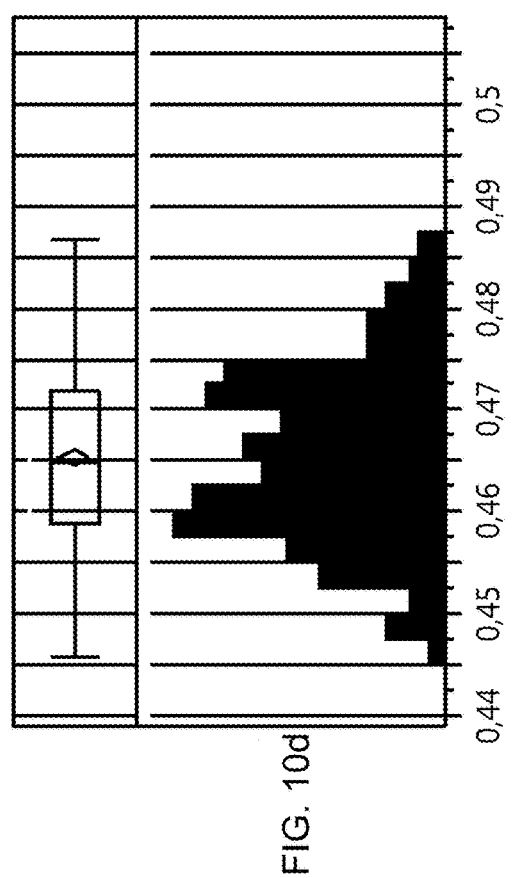
Figure 10B:
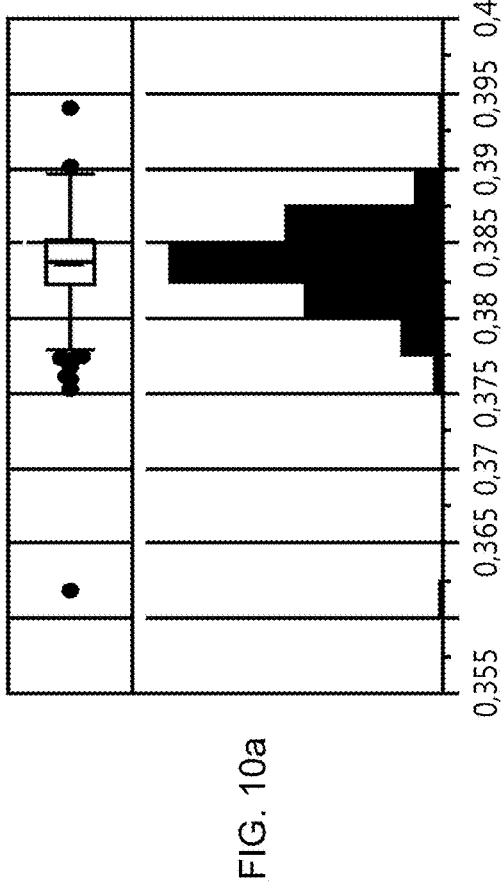
Figure 10D:
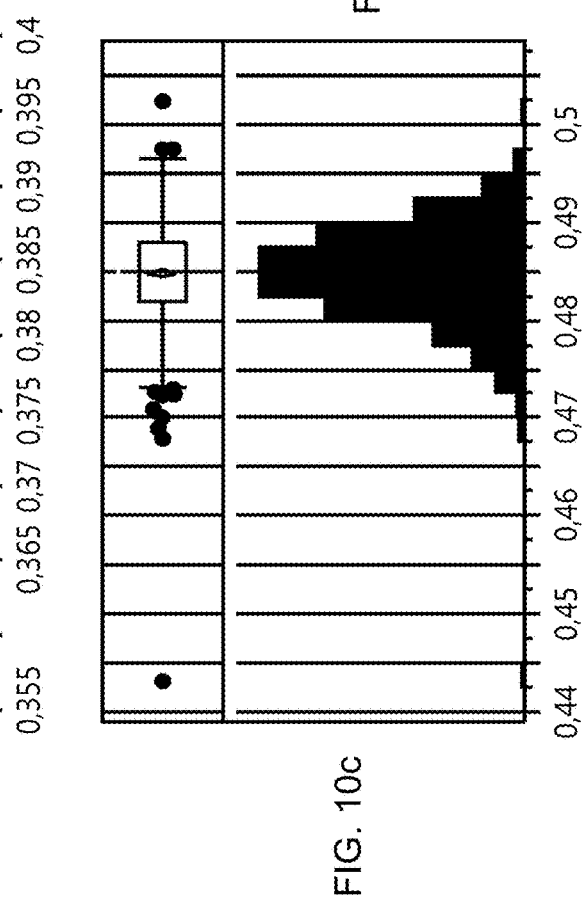

FIG. 10a shows the distribution of the cx-values of the samples according to the invention. In FIG. 10b the distribution of the cx-values of the reference samples is shown. FIGS. 10c and 10d show the distributions of the cy-values for samples according to the invention and for the reference samples, respectively. The standard deviations of the cx- and cy-distributions for the inventive samples (FIGS. 10a and 10c) are reduced by roughly a factor of 2 compared to the distributions of the reference samples. Generally, according to an embodiment of the invention it can be assumed that the standard deviation of the cx- and cy-values of the light emitted from a ceramic element according to the invention, measured at a multitude of samples is less than 0.005. Further, the cx-distribution is particular well defined. For the cx-values it can be assumed that the standard deviation of these values, measured at a multitude of samples is less than 0.003.

Figure 11:
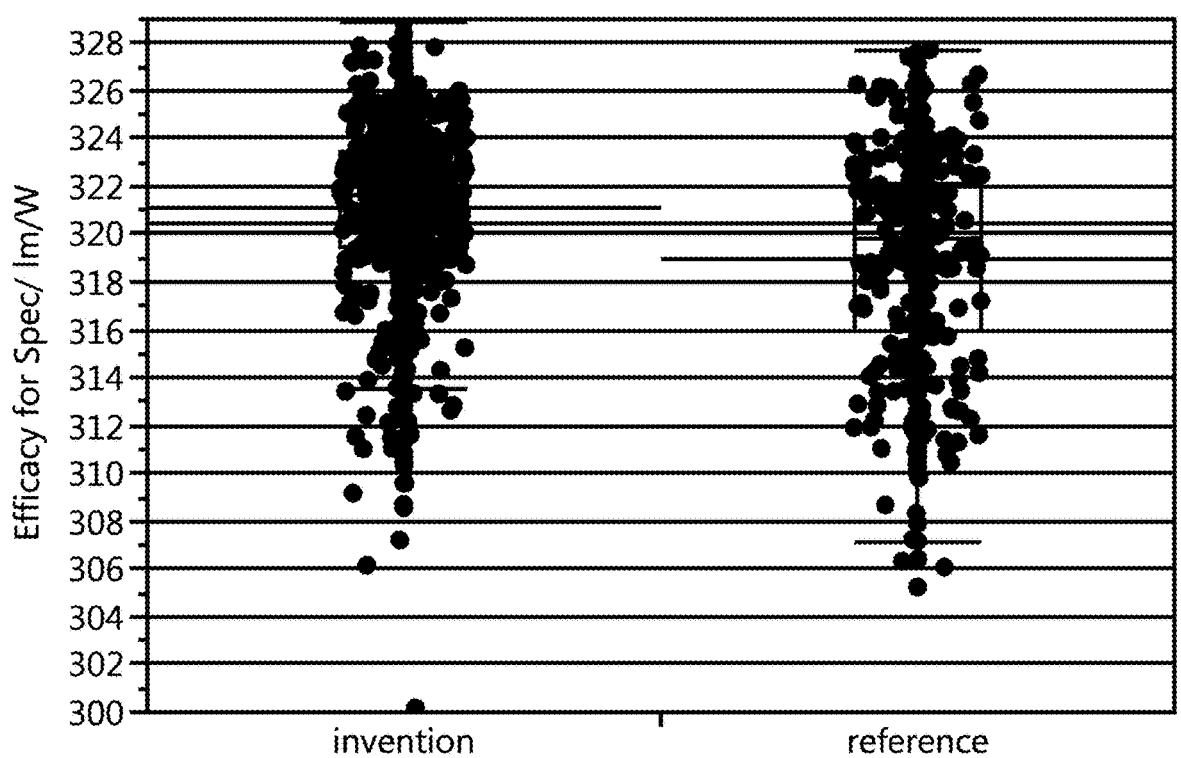
FIG. 11 shows efficacy values for a multitude of samples.
Figure 12A:
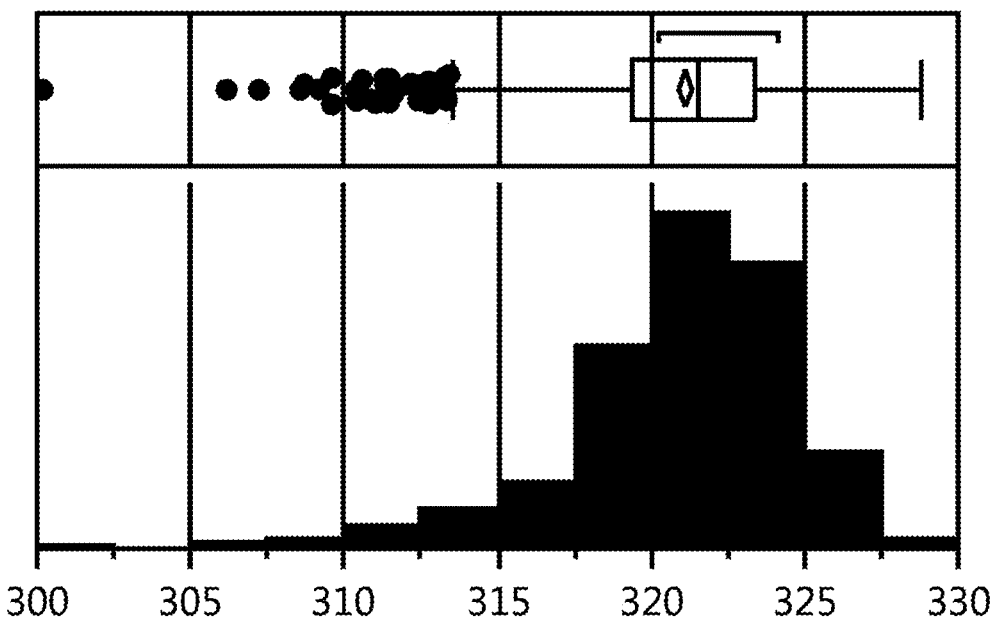
FIGS. 12a-12b show the statistical distributions of the values according to FIG. 11.
Figure 12B:
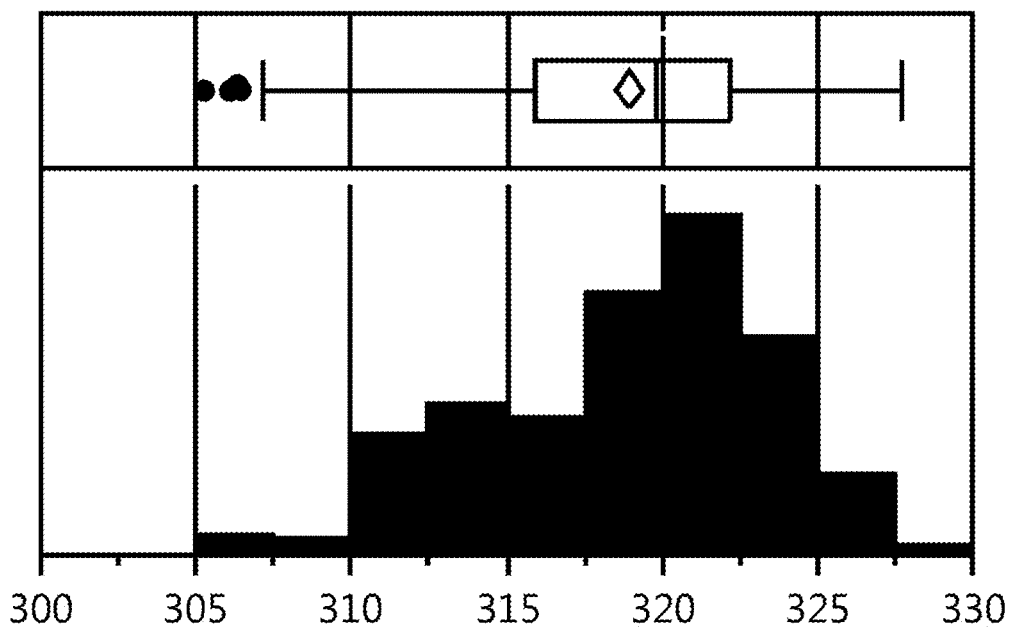

Similar effects are also found for the efficacy of the converters. FIG. 11 shows the efficacy values of the samples according to the invention and of the reference samples, measured as lumen per Watt (lm/W). FIGS. 12a-12b show the corresponding statistical distributions of the values. Therein, FIG. 12a is the distribution of the efficacy values for the inventive samples and FIG. 12b shows the efficacy of the reference samples. Although the median value of the efficacy of the inventive samples is only slightly higher than that of the reference samples, the distribution according to FIG. 12a is much narrower compared to that of the reference samples (FIG. 12b). Thus, the inventive samples show a more homogeneous emission both in terms of the chromaticity coordinates and the efficacy. According to one embodiment of the invention, it can be assumed that the standard deviation of the efficacy of ceramic elements according to the invention, measured in lm/W is less than 4 lm/W. The standard deviation of the efficacy according to FIG. 12a was measured to be 3.44.

| LIST OF REFERENCE SIGNS | |
|---|---|
| 1 | optical converter |
| 2 | light source |
| 3 | ceramic element |
| 4 | pressed blank |
| 5 | pore |
| 7 | characteristic distance |
| 9 | powdered starting material |
| 10 | particle of 9 |
| 11 | grain |
| 13 | void |
| 15 | pressed blank |
| 17 | press mold |
| 18 | stamp |

-continued

| LIST OF REFERENCE SIGNS | |
|---|---|
| 19 | die |
| 20 | converter wheel |
| 21 | carrier |
| 22 | Laser |
| 23 | laser beam |
| 24 | point of incidence |
| 25 | trace of 24 on 3 |
| 26 | emitted light beam |
| 27 | mount |
| 29 | coating |
| 31 | lens |

What is claimed is:

1. An optical converter comprising:
a ceramic element that is fluorescent so that light of a first wavelength is absorbed in the ceramic element and fluorescent light having longer wavelength is emitted, wherein the ceramic element comprises pores that are spatially irregularly distributed therein, the pores having a distribution that is inhomogeneous so that a radial distribution function of pore locations deviates from unity and has a maximum, at a characteristic distance, of at least 1.2 and less than 2.

2. The optical converter of claim 1, wherein that the radial distribution function converges to unity with increasing distances higher than the characteristic distance.

3. The optical converter of claim 1, wherein the radial distribution function, below the characteristic distance, diminishes towards shorter distances and drops below unity.

4. The optical converter of claim 1, wherein the maximum range is less than 2.

5. An optical converter comprising:
a ceramic element that is fluorescent so that light of a first wavelength is absorbed in the ceramic element and fluorescent light having longer wavelength is emitted, wherein the ceramic element comprises pores that are spatially irregularly distributed therein, the pores having a distribution that is inhomogeneous so that a radial distribution function of pore locations deviates from unity and has a maximum range at a characteristic distance, wherein the characteristic distance is in a range from 1.0 µm to 3 µm.

6. The optical converter of claim 1, wherein the radial distribution has a modal value of between 0.5 µm to 1.2 µm.

7. The optical converter of claim 1, wherein the radial distribution has a modal value of between 0.6 µm to 0.9 µm.

8. The optical converter of claim 1, wherein that the ceramic element is a material selected from a group consisting of a doped garnet phosphor, a cerium doped yttrium-aluminium garnet (Ce:YAG), a cerium doped a lutetium-aluminium garnet (Ce:LuAG), and a cerium doped yttrium/gadolinium garnet (Ce:Gd/YAG).

9. The optical converter of claim 1, wherein the ceramic element has a density of below 98 percent of a theoretical solid state density.

10. The optical converter of claim 1, wherein that the ceramic element absorbs blue light as light of a first wavelength and emits yellow or green light as the fluorescent light having the longer wavelength.

11. The optical converter of claim 1, wherein the ceramic element has a turbidity value for light having a wavelength of 570 nm that is larger than the turbidity value for light having a wavelength of 450 nm.

12. The optical converter of claim 1, further comprising a disc shaped carrier, wherein the ceramic element is a disc or ring shaped and is mounted on the so disc shaped carrier as to form a converter wheel.

13. The optical converter of claim 1, wherein the ceramic element has a standard deviation of cx-values and cy-values of emitted light that is less than 0.005.

14. The optical converter of claim 1, wherein the ceramic element has a standard deviation of efficacy, measured in lm/W, that is less than 4 lm/W.

15. A light source comprising:
an optical converter having a ceramic element;
a mount on which the ceramic element is fixed, wherein the mount is static or adapted to provide a rotational or reciprocating movement to the ceramic element; and
a source light emitter arranged to direct source light onto the ceramic element so that the optical converter emits secondary light having a longer wavelength than the source light, wherein the ceramic element comprises pores that are spatially irregularly distributed therein, the pores having a distribution that is inhomogeneous so that a radial distribution function of pore locations deviates from unity and has a maximum, at a characteristic distance, of at least 1.2 and less than 2.

* * * * *